(12) United States Patent
Jan

(10) Patent No.: US 9,158,089 B2
(45) Date of Patent: Oct. 13, 2015

(54) OPTICAL IMAGE CAPTURING MODULE AND METHOD OF MANUFACTURING THE SAME, AND OPTICAL AUXILIARY UNIT

(71) Applicant: LARVIEW TECHNOLOGIES CORP., Taoyuan County (TW)

(72) Inventor: Shin-Dar Jan, Hsinchu (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 104 days.

(21) Appl. No.: 14/152,552

(22) Filed: Jan. 10, 2014

(65) Prior Publication Data

US 2015/0198780 A1 Jul. 16, 2015

(51) Int. Cl.
| | |
|---|---|
| *G02B 7/02* | (2006.01) |
| *G02B 7/00* | (2006.01) |
| *H05K 13/00* | (2006.01) |
| *B32B 37/12* | (2006.01) |
| *B32B 38/00* | (2006.01) |
| *B32B 37/18* | (2006.01) |

(52) U.S. Cl.
CPC ............... *G02B 7/023* (2013.01); *B32B 37/12* (2013.01); *B32B 37/18* (2013.01); *B32B 38/0008* (2013.01); *G02B 7/006* (2013.01); *H05K 13/0023* (2013.01); *B32B 2551/00* (2013.01)

(58) Field of Classification Search
CPC .......... G02B 7/02; G02B 7/023; G02B 7/025; G02B 7/006; H05K 13/0486
See application file for complete search history.

(56) References Cited

U.S. PATENT DOCUMENTS 7,893,992 B2 * 2/2011 Vittu .............................. 348/374

* cited by examiner

*Primary Examiner* — Joseph P Martinez
(74) *Attorney, Agent, or Firm* — Li & Cai Intellectual Property (USA) Office

(57) ABSTRACT

An optical auxiliary unit includes a housing frame, an optical filter and an actuator structure. The housing frame is temporarily placed on a temporary auxiliary carrying substrate, and the housing frame has a bottom opening enclosed by the temporary auxiliary carrying substrate and a top opening opposite to the bottom opening. The optical filter is fixed on the housing frame, and the top opening of the housing frame is enclosed by the optical filter. The actuator structure is fixed on the housing frame to cover the optical filter, and the actuator structure includes a lens holder fixed on the housing frame and a movable lens assembly movably disposed inside the lens holder and above the optical filter.

15 Claims, 5 Drawing Sheets

OPTICAL IMAGE CAPTURING MODULE AND METHOD OF MANUFACTURING THE SAME, AND OPTICAL AUXILIARY UNIT

BACKGROUND OF THE INVENTION

1. Field of the Invention

The instant disclosure relates to an image capturing module and a method of manufacturing the same, and an auxiliary unit, and more particularly to an optical image capturing module and a method of manufacturing the same, and an optical auxiliary unit.

2. Description of Related Art

Recently, it becomes more and more popular for portable devices such as mobile phones or PDA to be equipped with an imaging module. Furthermore, since the market requires these portable devices to have more powerful functions and smaller sizes, it is necessary for the imaging module to generate high quality pictures and to be of small size accordingly. One improvement of picture quality is to increase the number of pixel. The pixel number of an imaging module has already increased from the VGA-level 30 pixels to 2, 5, 8, 13 or even 41 million pixels, which is now common in the market. Another improvement lies in the definition of the image. Thus, the imaging module of a portable device also develops from a fixed-focus mode to auto-focus mode or even optical zoom mode. The auto-focus mode employs the principle of moving the lens in the imaging module suitably according to various distances of targets, whereby the optical image of the desired target can be focused correctly on an image sensor so as to generate a clear image. The common ways of activating the lens to move in the imaging module include activating by a stepping motor, piezoelectric motor and voice coil motor (VCM).

SUMMARY OF THE INVENTION

One aspect of the instant disclosure relates to an optical image capturing module and a method of manufacturing the same, and an optical auxiliary unit.

One of the embodiments of the instant disclosure provides a method of manufacturing an optical image capturing module, comprising: temporarily placing a plurality of housing frames on a temporary auxiliary carrying substrate, wherein each housing frame has a bottom opening enclosed by the temporary auxiliary carrying substrate and a top opening opposite to the bottom opening; respectively fixing a plurality of optical filters on the housing frames, wherein the top opening of each housing frame is enclosed by the corresponding optical filter; respectively fixing a plurality of actuator structures on the housing frames to respectively covering the optical filters, wherein each actuator structure includes a lens holder fixed on the corresponding housing frame and a movable lens assembly movably disposed inside the lens holder and above the corresponding optical filter; and then removing the temporary auxiliary carrying substrate and respectively fixing the housing frames on a plurality of image sensing units, wherein each image sensing unit includes a circuit substrate and an image sensing chip disposed on the circuit substrate and electrically connected to the circuit substrate, and each housing frame is fixed on the circuit substrate of the corresponding image sensing unit for covering the image sensing chip of the corresponding image sensing unit.

More precisely, the step of respectively fixing the optical filters on the housing frames further comprises: placing each optical filter on the corresponding housing frame through first bonding glue, wherein each housing frame has a concave space formed on the top side thereof, and each optical filter is received inside the concave space of the corresponding housing frame through the first bonding glue; and then curing the first bonding glue by ultraviolet lights or a drying oven for fixing each optical filter inside the concave space of the corresponding housing frame through the first bonding glue.

More precisely, the step of respectively fixing the actuator structures on the housing frames further comprises: placing the lens holder of each actuator structure on the corresponding housing frame through second bonding glue; and then curing the second bonding glue by ultraviolet lights or a drying oven for fixing the lens holder of each actuator structure on the corresponding housing frame through the second bonding glue.

More precisely, the step of respectively fixing the housing frames on the image sensing units further comprises: placing each housing frame on the circuit substrate of the corresponding image sensing unit through third bonding glue; and then curing the third bonding glue by ultraviolet lights or a drying oven for fixing each housing frame on the circuit substrate of the corresponding image sensing unit through the third bonding glue.

More precisely, before the step of respectively fixing the housing frames on the image sensing units, method of manufacturing the optical image capturing module further comprises: placing each image sensing chip on the corresponding circuit substrate through fourth bonding glue; and then curing the fourth bonding glue by ultraviolet lights or a drying oven for fixing each image sensing chip on the corresponding circuit substrate through the fourth bonding glue.

Another one of the embodiments of the instant disclosure provides an optical image capturing module comprises an optical auxiliary unit composed of the housing frame, the optical filter and the actuator structure, the optical filter is fixed inside a concave space of the housing frame through first bonding glue, and the lens holder of the actuator structure is fixed on the housing frame through second bonding glue. In addition, the optical auxiliary unit and the image sensing unit are mated with each other, the image sensing chip is fixed on the circuit substrate through fourth bonding glue, and the housing frame is fixed on the circuit substrate through third bonding glue.

Yet one of the embodiments of the instant disclosure provides an optical auxiliary unit, comprising: a housing frame, an optical filter and an actuator structure. The housing frame is temporarily placed on a temporary auxiliary carrying substrate, wherein the housing frame has a bottom opening enclosed by the temporary auxiliary carrying substrate and a top opening opposite to the bottom opening. The optical filter is fixed on the housing frame, wherein the top opening of the housing frame is enclosed by the optical filter. The actuator structure is fixed on the housing frame to cover the optical filter, wherein the actuator structure includes a lens holder fixed on the housing frame and a movable lens assembly movably disposed inside the lens holder and above the optical filter.

Yet another one of the embodiments of the instant disclosure provides a method of manufacturing an optical image capturing module, comprising: temporarily placing a plurality of housing frames on a temporary auxiliary carrying substrate; respectively fixing a plurality of optical filters on the housing frames; respectively fixing a plurality of actuator structures on the housing frames to respectively covering the optical filters; and then removing the temporary auxiliary carrying substrate and respectively fixing the housing frames on a plurality of image sensing units.

More precisely, the step of respectively fixing the optical filters on the housing frames further comprises: placing each optical filter on the corresponding housing frame through first bonding glue, wherein each housing frame has a concave space formed on the top side thereof, and each optical filter is received inside the concave space of the corresponding housing frame through the first bonding glue; and then curing the first bonding glue by ultraviolet lights or a drying oven for fixing each optical filter inside the concave space of the corresponding housing frame through the first bonding glue.

More precisely, the step of respectively fixing the actuator structures on the housing frames further comprises: placing each actuator structure on the corresponding housing frame through second bonding glue; and then curing the second bonding glue by ultraviolet lights or a drying oven for fixing each actuator structure on the corresponding housing frame through the second bonding glue.

More precisely, the step of respectively fixing the housing frames on the image sensing units further comprises: placing each housing frame on the corresponding image sensing unit through third bonding glue; and then curing the third bonding glue by ultraviolet lights or a drying oven for fixing each housing frame on the corresponding image sensing unit through the third bonding glue.

Therefore, the method of manufacturing the optical image capturing module includes temporarily placing a plurality of housing frames on a temporary auxiliary carrying substrate, respectively fixing a plurality of optical filters on the housing frames, respectively fixing a plurality of actuator structures on the housing frames to respectively covering the optical filters, and then removing the temporary auxiliary carrying substrate and respectively fixing the housing frames on a plurality of image sensing units each including a circuit substrate and an image sensing chip disposed on the circuit substrate and electrically connected to the circuit substrate, thus the production efficiency and the production yield rate of the instant disclosure are increased.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

Figure 1:
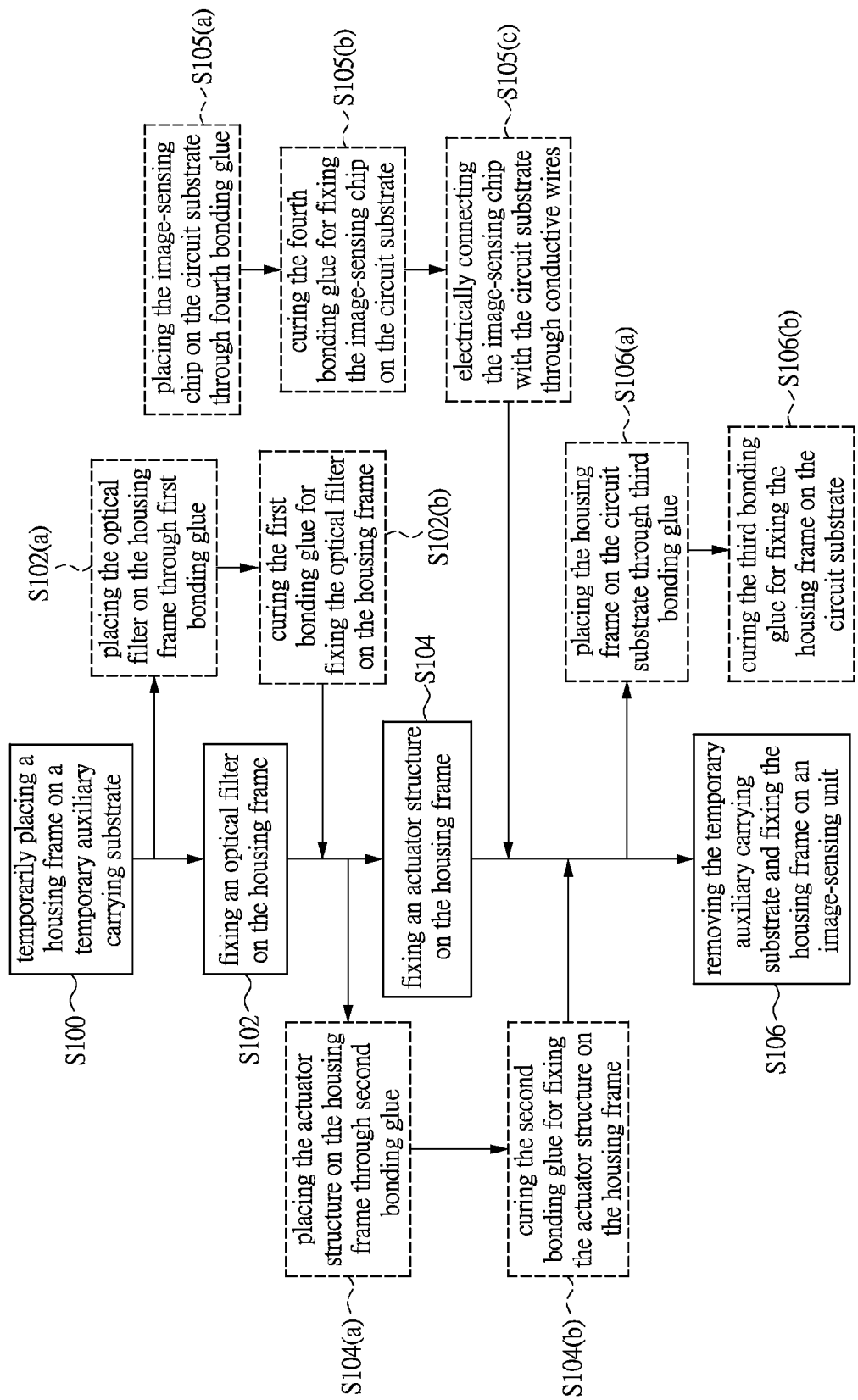
FIG. 1 shows a flow chart of the method of manufacturing an optical image capturing module according to the instant disclosure.
Figure 2:
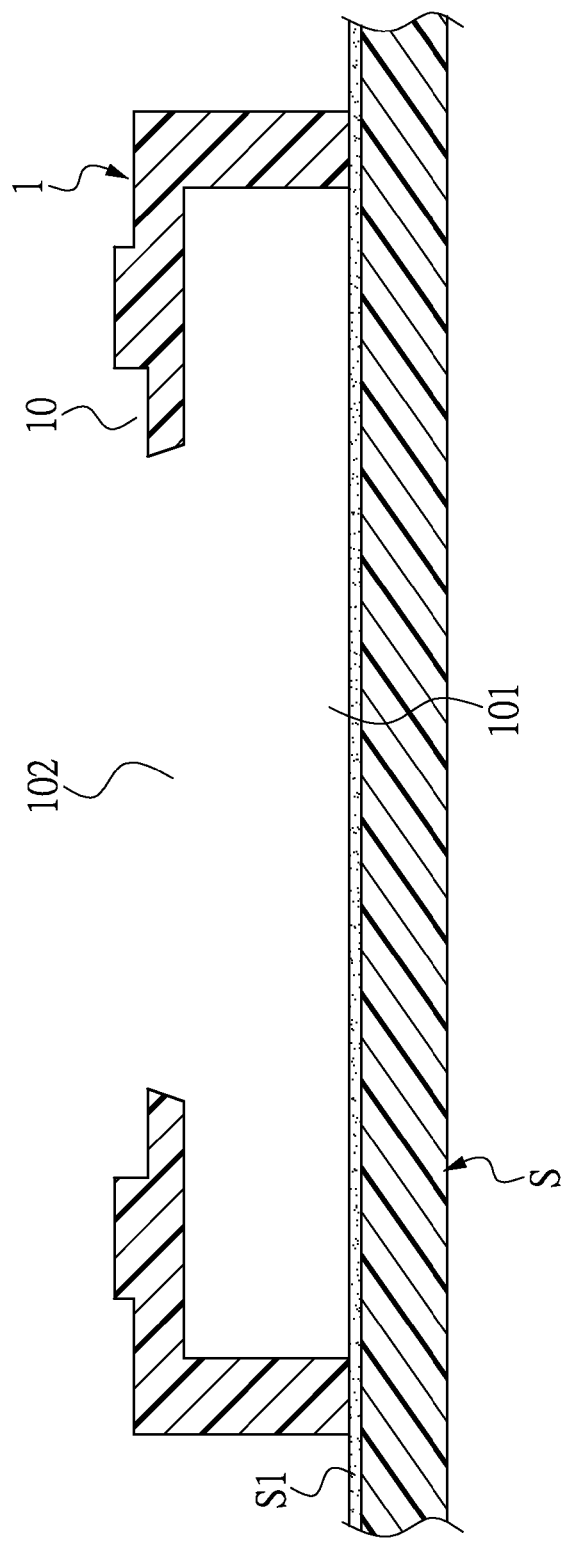
FIG. 2 shows a lateral, cross-sectional, schematic view of temporarily placing a plurality of housing frames on a temporary auxiliary carrying substrate according to the instant disclosure.

Referring to FIG. 1 to FIG. 5, the instant disclosure provides a method of manufacturing an optical image capturing module M, comprising the following steps:

First, referring to FIG. 1 and FIG. 2, the step S100 is that: temporarily placing a plurality of housing frames 1 (only one housing frame 1 shown in FIG. 1 for example) on a temporary auxiliary carrying substrate S. In addition, each housing frame 1 has a bottom opening 101 enclosed by the temporary auxiliary carrying substrate S and a top opening 102 opposite to the bottom opening 101. For example, the temporary auxiliary carrying substrate S has an adhesive layer S1 disposed on the top surface of the temporary auxiliary carrying substrate S, and the housing frames 1 are temporarily disposed the temporary auxiliary carrying substrate S through the adhesive layer S1.

Figure 3:
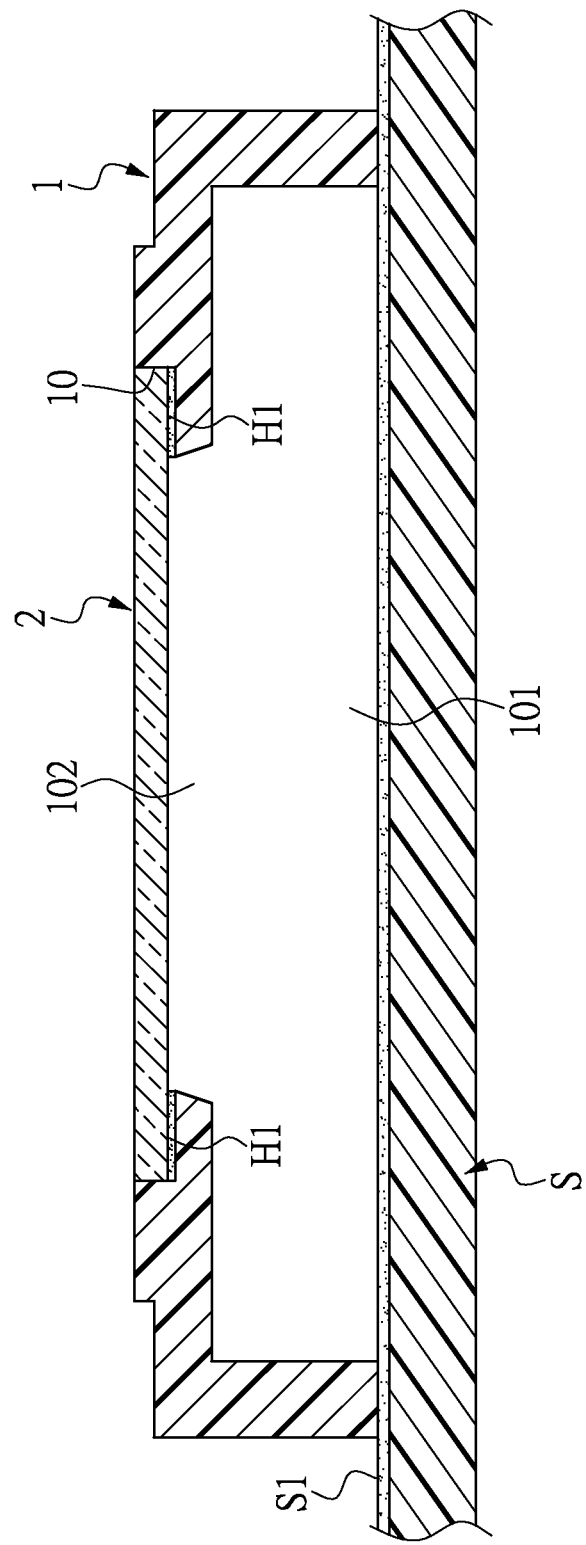
FIG. 3 shows a lateral, cross-sectional, schematic view of respectively fixing a plurality of optical filters on the housing frames according to the instant disclosure.

Moreover, referring to FIG. 1 and FIG. 3, the step S102 is that: respectively fixing a plurality of optical filters 2 (only one optical filter 2 shown in FIG. 3 for example) on the housing frames 1. In addition, the top opening 102 of each housing frame 1 is enclosed by the corresponding optical filter 2, thus external air particles cannot go into the housing frame 1 through the top opening 102. For example, the step of respectively fixing the optical filters 2 on the housing frames 1 further comprises: placing each optical filter 2 on the corresponding housing frame 1 through first bonding glue H1 (such as UV adhesive glue, thermosetting glue, or oven curing glue, etc.), wherein each housing frame 1 has a concave space 10 formed on the top side of the housing frame 1, and each optical filter 2 is received inside the concave space 10 of the corresponding housing frame 1 through the first bonding glue H1 (S102(a)); and then curing the first bonding glue H1 by ultraviolet lights (not shown) or a drying oven (not shown) for fixing each optical filter 2 inside the concave space 10 of the corresponding housing frame 1 through the cured first bonding glue H1 (S102(b)).

Figure 4:
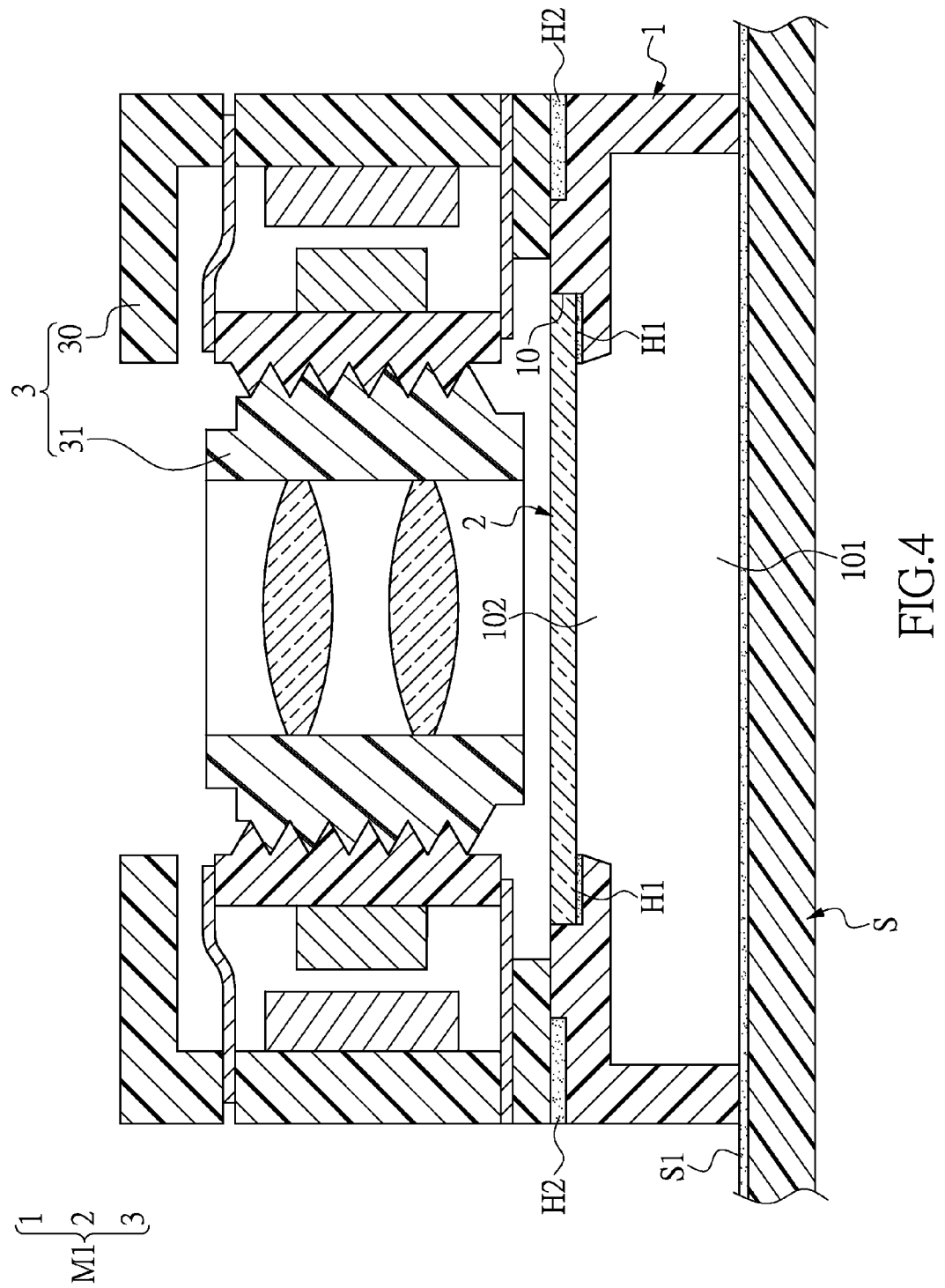
FIG. 4 shows a lateral, cross-sectional, schematic view of respectively fixing a plurality of actuator structures on the housing frames to respectively covering the optical filters according to the instant disclosure.

Furthermore, referring to FIG. 1 and FIG. 4, the step S104 is that: respectively fixing a plurality of actuator structures 3 (only one actuator structure 3 shown in FIG. 4 for example) on the housing frames 1 to respectively covering the optical filters 2. In addition, each actuator structure 3 includes a lens holder 30 fixed on the corresponding housing frame 1 and a movable lens assembly 31 movably disposed inside the lens holder 30 and above the corresponding optical filter 2. For example, the step of respectively fixing the actuator structures 3 on the housing frames 1 further comprises: placing the lens holder 30 of each actuator structure 3 on the corresponding housing frame 1 through second bonding glue H2 (such as UV adhesive glue, thermosetting glue, or oven curing glue, etc.) (S104(a)); and then curing the second bonding glue H2 by ultraviolet lights or a drying oven for fixing the lens holder 30 of each actuator structure 3 on the corresponding housing frame 1 through the cured second bonding glue H2 (S104(b)).

Figure 5:
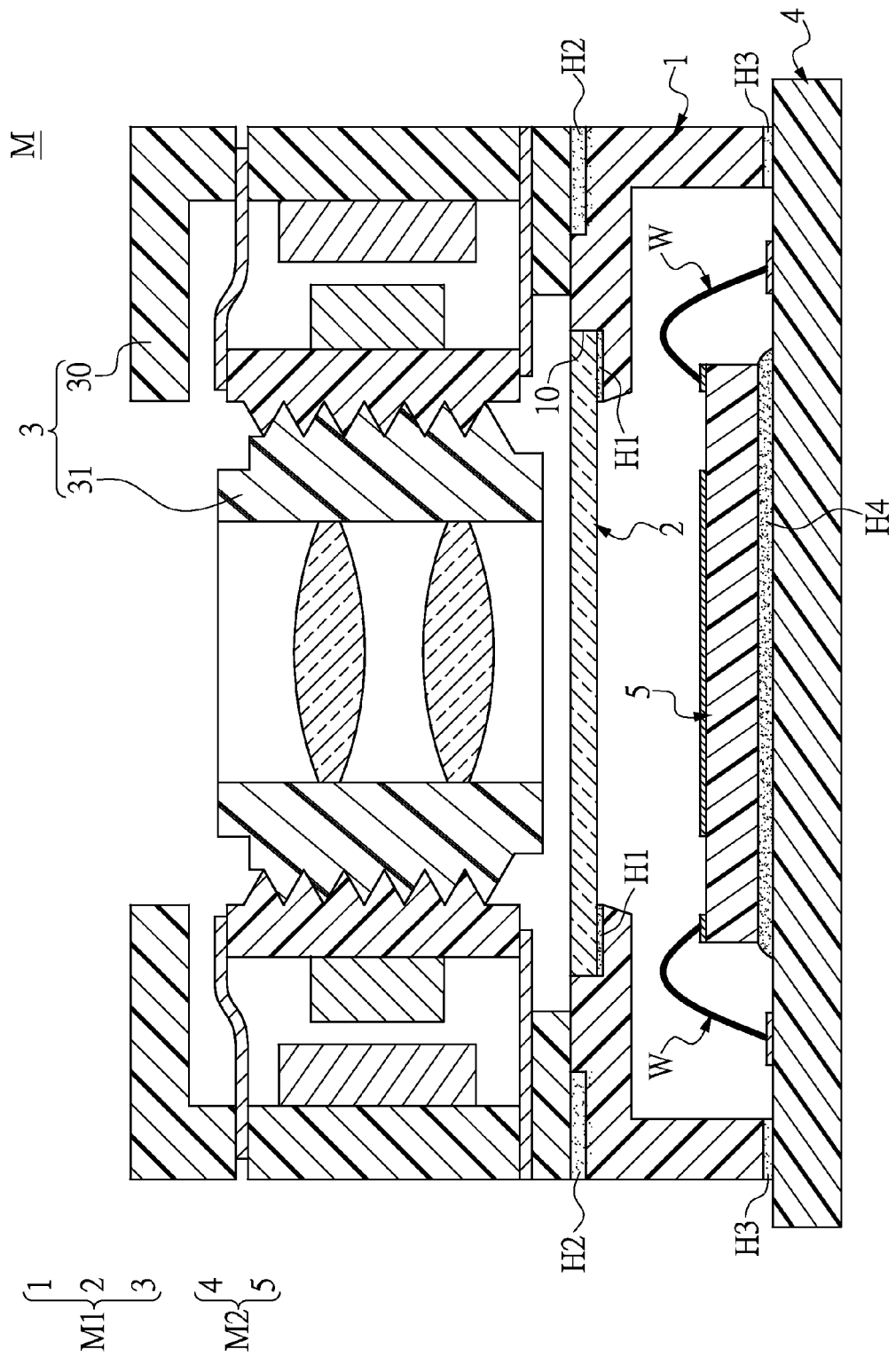
FIG. 5 shows a lateral, cross-sectional, schematic view of the optical image capturing module according to the instant disclosure.

Besides, referring to FIG. 1, FIG. 4 and FIG. 5, the step S106 is that: removing the temporary auxiliary carrying substrate S and respectively fixing the housing frames 1 on a plurality of image sensing units M2 (only one image sensing unit M2 shown in FIG. 5 for example). In addition, each image sensing unit M2 includes a circuit substrate 4 and an image sensing chip 5 (such as CMOS sensor chip) disposed on the circuit substrate 4 and electrically connected to the circuit substrate 4, and each housing frame 1 is fixed on the circuit substrate 4 of the corresponding image sensing unit M2 for covering the image sensing chip 5 of the corresponding image sensing unit M2. For example, the step of respectively fixing the housing frames 1 on the image sensing units M2 further comprises: placing each housing frame 1 on the circuit substrate 4 of the corresponding image sensing unit M2 through third bonding glue H3 (such as UV adhesive glue, thermosetting glue, or oven curing glue, etc.) (S106(a)); and then curing the third bonding glue H3 by ultraviolet lights or a drying oven for fixing each housing frame 1 on the circuit substrate 4 of the corresponding image sensing unit M2 through the cured third bonding glue H3 (S106(b)).

Moreover, referring to FIG. 1 and FIG. 5, before the step S106 of respectively fixing the housing frames 1 on the image sensing units M2, method of manufacturing the optical image capturing module M further comprises: placing each image sensing chip 5 on the corresponding circuit substrate 4 through fourth bonding glue H4 (such as UV adhesive glue, thermosetting glue, or oven curing glue, etc.) (S105(a)); curing the fourth bonding glue H4 by ultraviolet lights or a drying oven for fixing each image sensing chip 5 on the corresponding circuit substrate 4 through the cured fourth bonding glue H4 (S105(b)); and then electrically connecting each image sensing chip 5 with the corresponding circuit substrate 4 through conductive wires W (S105(c)). More precisely, the circuit substrate 4 has a plurality of conductive pads (not labeled) disposed on the top surface of the circuit substrate 4, and the image sensing chip 5 has a plurality of conductive pads (not labeled) disposed on the top surface of the image sensing chip 5. Each conductive pad of the image sensing chip 5 is electrically connected to the corresponding conducive pad of the circuit substrate 4 through the corresponding conductive wire W, thus the image sensing chip 5 can be electrically connected with the circuit substrate 4 through the conductive wires W.

More precisely, the instant disclosure further provides an optical image capturing module M manufactured by the above-mentioned method. The optical image capturing module M comprises an optical auxiliary unit M1 and an image sensing unit M2 mated with the optical auxiliary unit M1. The optical auxiliary unit M1 may be composed of the housing frame 1, the optical filter 2 and the actuator structure 3. The optical filter 2 is fixed inside the concave space 10 of the housing frame 1 through the first bonding glue H1, and the lens holder 30 of the actuator structure 3 is fixed on the housing frame 1 through the second bonding glue H2. In addition, the image sensing unit M2 may be composed of the circuit substrate 4 and the image sensing chip 5 that is fixed on the circuit substrate 4 through the fourth bonding glue H4, and the housing frame 1 is fixed on the circuit substrate 4 through the third bonding glue H3.

It's worth mentioning that the instant disclosure provides an optical auxiliary unit M1 as a semi-finished product of the optical image capturing module M, and the optical auxiliary unit M1 includes a housing frame 1, an optical filter 2 and an actuator structure 3.

More precisely, the housing frame 1 is temporarily placed on a temporary auxiliary carrying substrate S, and the housing frame 1 has a bottom opening 101 enclosed by the temporary auxiliary carrying substrate S and a top opening 102 opposite to the bottom opening 101. Whereby, because the top opening 102 of the housing frame 1 is enclosed by the optical filter 2, external air particles cannot go into the housing frame 1 through the bottom opening 101. For example, the temporary auxiliary carrying substrate S has an adhesive layer S1 disposed on the top surface of the temporary auxiliary carrying substrate S, and the housing frames 1 are temporarily disposed the temporary auxiliary carrying substrate S through the adhesive layer S1.

More precisely, the optical filter 2 is fixed on the housing frame 1, and the top opening 102 of the housing frame 1 is enclosed by the optical filter 2, thus external air particles cannot go into the housing frame 1 through the top opening 102. For example, the optical filter 2 may be a flat glass plate having an infrared (IR) coated layer and/or an antireflection (AR) coating layer, and the optical filter 2 is fixed inside a concave space 10 of the housing frame 1 through first bonding glue H1.

More precisely, the actuator structure 3 is fixed on the housing frame 1 to cover the optical filter 2, and the actuator structure 3 includes a lens holder 30 fixed on the housing frame 1 and a movable lens assembly 31 movably disposed inside the lens holder 30 and above the optical filter 2. For example, the actuator structure 3 may be a voice coil motor (VCM), and the movable lens assembly 31 may be composed of a plurality of optical lens (not labeled), but it is merely an example and is not meant to limit the instant disclosure. In addition, the lens holder 30 of the actuator structure 3 is fixed on the housing frame 1 through second bonding glue H2.

In conclusion, the method of manufacturing the optical image capturing module M includes temporarily placing a plurality of housing frames 1 on a temporary auxiliary carrying substrate S, respectively fixing a plurality of optical filters 2 on the housing frames 1, respectively fixing a plurality of actuator structures 3 on the housing frames 1 to respectively covering the optical filters 2, and then removing the temporary auxiliary carrying substrate S and respectively fixing the housing frames 1 on a plurality of image sensing units M2 each including a circuit substrate 4 and an image sensing chip 5 disposed on the circuit substrate 4 and electrically connected to the circuit substrate 4, thus the production efficiency and the production yield rate of the instant disclosure are increased.

The above-mentioned descriptions merely represent the preferred embodiments of the instant disclosure, without any intention or ability to limit the scope of the instant disclosure which is fully described only within the following claims. Various equivalent changes, alterations or modifications based on the claims of instant disclosure are all, consequently, viewed as being embraced by the scope of the instant disclosure.

What is claimed is:

1. A method of manufacturing an optical image capturing module, comprising:
    temporarily placing a plurality of housing frames on a temporary auxiliary carrying substrate, wherein each housing frame has a bottom opening enclosed by the temporary auxiliary carrying substrate and a top opening opposite to the bottom opening;
    respectively fixing a plurality of optical filters on the housing frames, wherein the top opening of each frame is enclosed by the corresponding optical filter;
    respectively fixing a plurality of actuator structures on the housing frames to respectively covering the optical filters, wherein each actuator structure includes a lens holder fixed on the corresponding housing frame and a movable lens assembly movably disposed inside the lens holder and above the corresponding optical filter; and
    removing the temporary auxiliary carrying substrate and respectively fixing the housing frames on a plurality of image sensing units, wherein each image sensing unit includes a circuit substrate and an image sensing chip disposed on the circuit substrate and electrically connected to the circuit substrate, and each housing frame is fixed on the circuit substrate of the corresponding image sensing unit for covering the image sensing chip of the corresponding image sensing unit.

2. The method of claim 1, wherein the temporary auxiliary carrying substrate has an adhesive layer disposed on the top surface thereof, and the housing frames are temporarily disposed the temporary auxiliary carrying substrate through the adhesive layer.

3. The method of claim 1, wherein the step of respectively fixing the optical filters on the housing frames further comprises:
   placing each optical filter on the corresponding housing frame through first bonding glue, wherein each housing frame has a concave space formed on the top side thereof, and each optical filter is received inside the concave space of the corresponding housing frame through the first bonding glue; and
   curing the first bonding glue by ultraviolet lights or a drying oven for fixing each optical filter inside the concave space of the corresponding housing frame through the first bonding glue.

4. The method of claim 1, wherein the step of respectively fixing the actuator structures on the housing frames further comprises:
   placing the lens holder of each actuator structure on the corresponding housing frame through second bonding glue; and
   curing the second bonding glue by ultraviolet lights or a drying oven for fixing the lens holder of each actuator structure on the corresponding housing frame through the second bonding glue.

5. The method of claim 1, wherein the step of respectively fixing the housing frames on the image sensing units further comprises:
   placing each housing frame on the circuit substrate of the corresponding image sensing unit through third bonding glue; and
   curing the third bonding glue by ultraviolet lights or a drying oven for fixing each housing frame on the circuit substrate of the corresponding image sensing unit through the third bonding glue.

6. The method of claim 1, wherein before the step of respectively fixing the housing frames on the image sensing units, method of manufacturing the optical image capturing module further comprises:
   placing each image sensing chip on the corresponding circuit substrate through fourth bonding glue; and
   curing the fourth bonding glue by ultraviolet lights or a drying oven for fixing each image sensing chip on the corresponding circuit substrate through the fourth bonding glue.

7. The method of claim 1, wherein the optical image capturing module comprises an optical auxiliary unit composed of the housing frame, the optical filter and the actuator structure, the optical filter is fixed inside a concave space of the housing frame through first bonding glue, and the lens holder of the actuator structure is fixed on the housing frame through second bonding glue.

8. The method of claim 7, wherein the optical auxiliary unit and the image sensing unit are mated with each other, the image sensing chip is fixed on the circuit substrate through fourth bonding glue, and the housing frame is fixed on the circuit substrate through third bonding glue.

9. An optical auxiliary unit, comprising:
   a housing frame temporarily placed on a temporary auxiliary carrying substrate, wherein the housing frame has a bottom opening enclosed by the temporary auxiliary carrying substrate and a top opening opposite to the bottom opening;
   an optical filter fixed on the housing frame, wherein the top opening of the housing frame is enclosed by the optical filter; and
   an actuator structure fixed on the housing frame to cover the optical filter, wherein the actuator structure includes a lens holder fixed on the housing frame and a movable lens assembly movably disposed inside the lens holder and above the optical filter.

10. The optical auxiliary unit of claim 9, wherein the temporary auxiliary carrying substrate has an adhesive layer disposed on the top surface thereof, and the housing frames are temporarily disposed the temporary auxiliary carrying substrate through the adhesive layer, wherein the optical filter is fixed inside a concave space of the housing frame through first bonding glue, and the lens holder of the actuator structure is fixed on the housing frame through second bonding glue.

11. A method of manufacturing an optical image capturing module, comprising:
   temporarily placing a plurality of housing frames on a temporary auxiliary carrying substrate;
   respectively fixing a plurality of optical filters on the housing frames;
   respectively fixing a plurality of actuator structures on the housing frames to respectively covering the optical filters; and
   removing the temporary auxiliary carrying substrate and respectively fixing the housing frames on a plurality of image sensing units.

12. The method of claim 11, wherein the temporary auxiliary carrying substrate has an adhesive layer disposed on the top surface thereof, and the housing frames are temporarily disposed the temporary auxiliary carrying substrate through the adhesive layer.

13. The method of claim 11, wherein the step of respectively fixing the optical filters on the housing frames further comprises:
   placing each optical filter on the corresponding housing frame through first bonding glue, wherein each housing frame has a concave space formed on the top side thereof, and each optical filter is received inside the concave space of the corresponding housing frame through the first bonding glue; and
   curing the first bonding glue by ultraviolet lights or a drying oven for fixing each optical filter inside the concave space of the corresponding housing frame through the first bonding glue.

14. The method of claim 11, wherein the step of respectively fixing the actuator structures on the housing frames further comprises:
   placing each actuator structure on the corresponding housing frame through second bonding glue; and
   curing the second bonding glue by ultraviolet lights or a drying oven for fixing each actuator structure on the corresponding housing frame through the second bonding glue.

15. The method of claim 11, wherein the step of respectively fixing the housing frames on the image sensing units further comprises:
   placing each housing frame on the corresponding image sensing unit through third bonding glue; and
   curing the third bonding glue by ultraviolet lights or a drying oven for fixing each housing frame on the corresponding image sensing unit through the third bonding glue.

* * * * *